Figure 1:
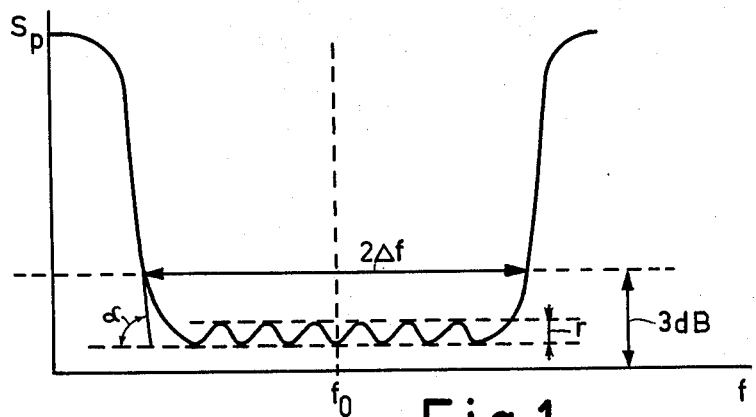

ND-322
XR 3,983,518

United States Patent
Bezemer

[11] 3,983,518
[45] Sept. 28, 1976

[54] FILTER CHAIN
[75] Inventor: Jan Adrianus Bezemer, Zwijndrecht, Netherlands
[73] Assignee: De Statt der Nederlanden, te Dezen Vertegenwoordigd Door de Directeur-General der Posterijen, Telegrafie en Telefonie, The Hague, Netherlands
[22] Filed: Apr. 24, 1975
[21] Appl. No.: 571,408

[52] U.S. Cl............................... 333/70 R; 310/8.2; 310/9.8; 333/72
[51] Int. Cl.²..................... H03H 9/26; H03H 7/14; H04R 17/00
[58] Field of Search.......................... 333/72, 70 R; 310/8, 8.1, 8.2, 9.4, 9.6, 9.8

[56] References Cited
UNITED STATES PATENTS

| 3,585,537 | 6/1971 | Rennick et al................ | 333/72 |
| 3,624,564 | 11/1971 | Ise et al...................... | 333/72 |
| 3,633,134 | 1/1972 | Barrows et al................ | 333/72 |
| 3,676,806 | 7/1972 | Orchard et al................ | 333/72 |
| 3,727,154 | 4/1973 | Dailing et al................. | 333/72 |

OTHER PUBLICATIONS
Smythe "Communications Systems Benefit from Monolithic Crystal Filters" in Electronics, Jan. 31, 1972; pp. 48–51.

Primary Examiner—Alfred E. Smith
Assistant Examiner—Marvin Nussbaum
Attorney, Agent, or Firm—Frank R. Trifari; Bernard Franzblau

[57] ABSTRACT

Filter chain comprising a number of monolithic units of piezoelectric material, which units vibrate according to the thickness shear mode and are provided with at least two acoustically coupled resonators and are coupled electrically one to another. The acoustic coupling between said resonators is equal for all units, whereas the electric coupling impedances between the units are substantially ohmic. Due to this the pass band of the filter is determined by the acoustic couplings and there is no need for an adjustment of the electric coupling between the units.

8 Claims, 16 Drawing Figures

FILTER CHAIN

The invention relates to a filter chain for letting pass a frequency band, comprising a number of monolithic filter units made of quartz or other high-quality piezoelectric material, which filter units vibrate according to the thickness shear mode, are each provided with at least two accoustically coupled resonators and are coupled electrically.

The manufacture of filter units of higher order meets with production-technical difficulties so that a number of filter units of lower order connected in series are often preferred. The latter require more electric couplings. The electric coupling impedances, however, detune the resonators, so that, when designing the filter it has already to be taken into account that the frequencies belonging to each of the resonators may not all be made equal. The design according to this method, however, also requires electric coupling coefficients which are different from one another. Consequently, the design and the manufacture of such a filter will be time-absorbing and expensive.

The invention offers a solution to the problem posed, because the acoustic coupling coefficients are all equal and because the electric coupling impedances, at least within the frequency pass band of the filter chain, are ohmic or almost ohmic, the electric coupling impedances being very large with respect to the equivalent acoustic coupling impedances. Now the electric coupling no longer influence the pass band so that the acoustic couplings are determinative of the filter pass band. In consequence of the absence of resonance frequencies it is now necessary to have more electric couplings, but these couplings are no longer so inconvenient. The term "ohmic" means that the electric coupling impedance causes no phase shift within the resonant frequency band of the filter.

According to a preferential embodiment the filter chain comprises $a$ filter units each having three resonators, and $b$ filter units each having two resonators, $2a + b + 1$ resonances falling within the pass band.

Figure 2:
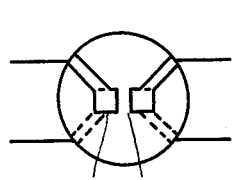
Figure 3:
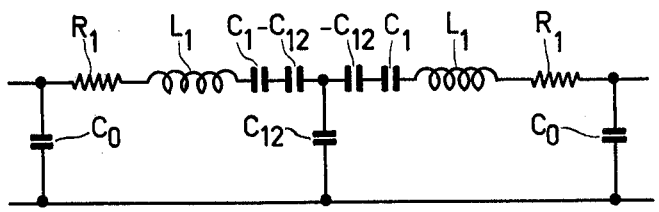
Figure 4:
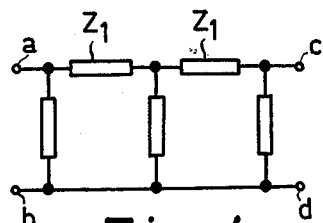
Figure 5:
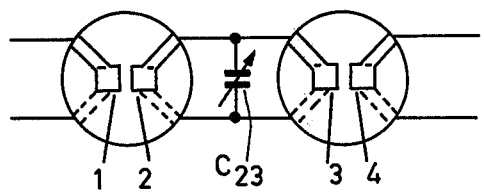
Figure 6:
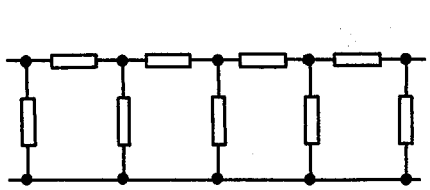
Figure 7:
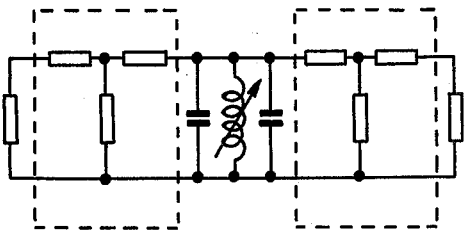
Figure 8:
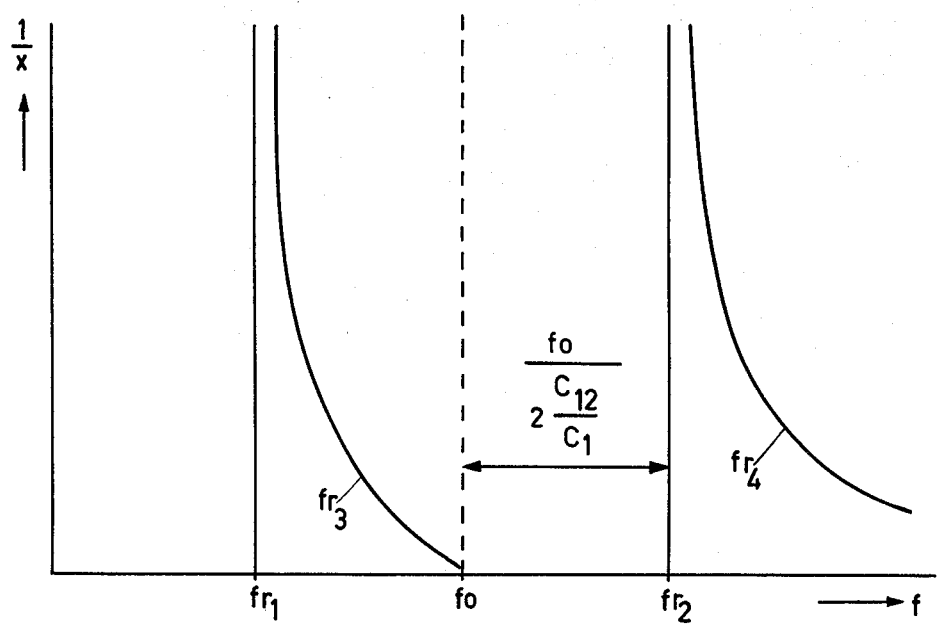
Figure 9:
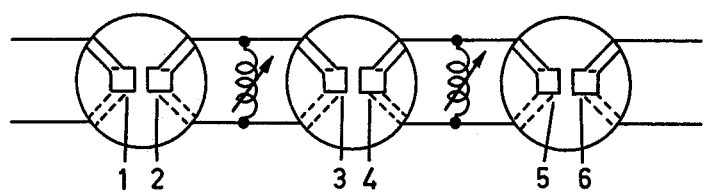
Figure 10:
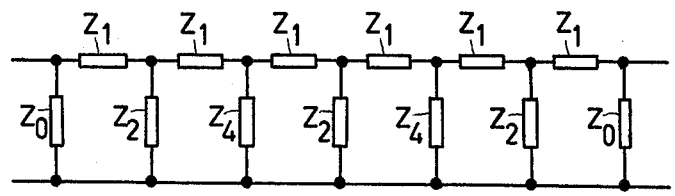
Figure 11:
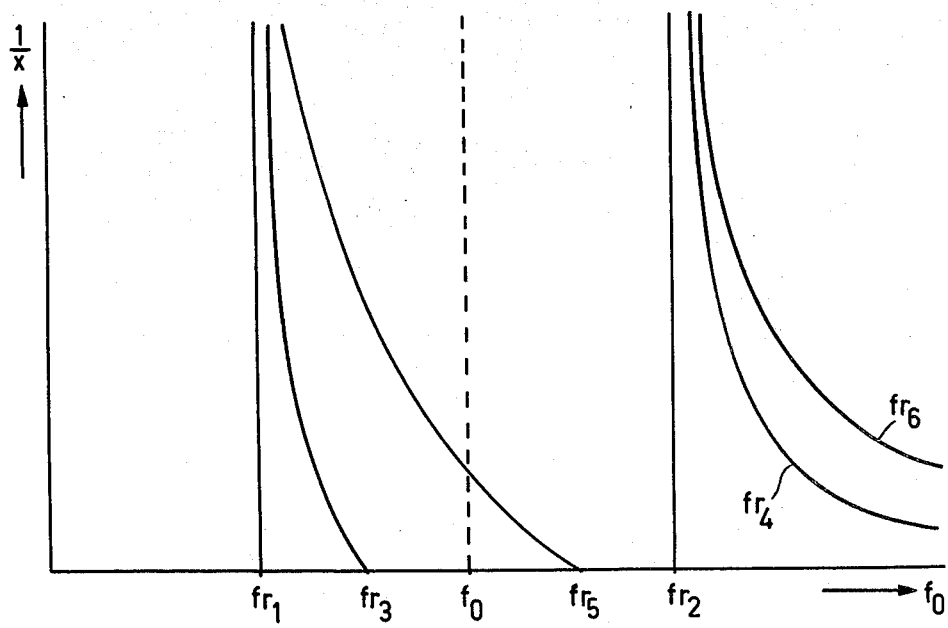
Figure 12:
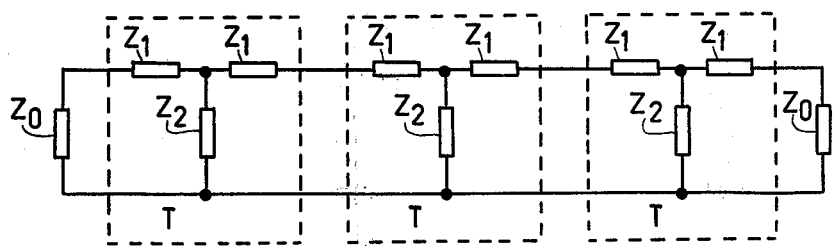
Figure 13:
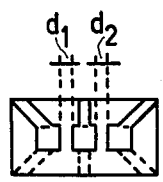
Figure 14:
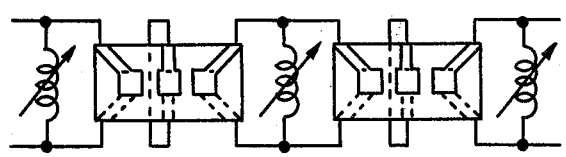
Figure 15:
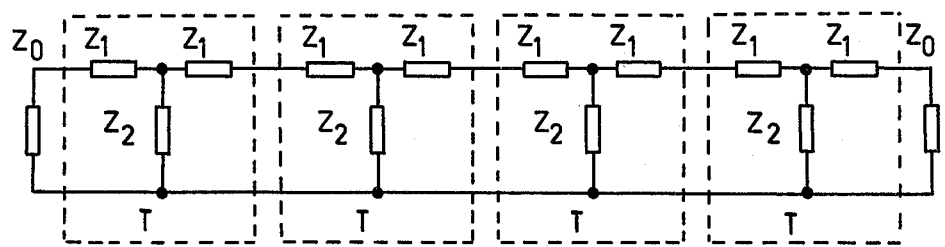

The invention will be elucidated with the help of the drawings, in which:

FIG. 1 shows a graphical representation of the relation between attenuation and frequency;
FIG. 2 a two-pole filter unit, called a dual;
FIG. 3 an equivalent circuit of a dual;
FIG. 4 a simplified equivalent circuit of FIG. 3;
FIG. 5 two duals coupled according to a known technique;
FIG. 6 an equivalent circuit of the circuit according to FIG. 5;
FIG. 7 an equivalent circuit of two duals coupled according to the invention;
FIG. 8 a graphical representation of the relation between the equivalent acoustic and the electric coupling impedance on the one side and the frequency on the other side;
FIG. 9 three duals coupled according to the invention;
FIG. 10 an equivalent circuit of the circuit according to FIG. 9;
FIG. 11 a grahical representation of a relation as shown in FIG. 8, but with reference to the circuit according to the FIGS. 9 and 10;
FIG. 12 a simplified equivalent circuit diagram of the circuit according to FIG. 10;
FIG. 13 a three-pole filter unit;
FIG. 14 two three-pole filter units coupled according to the invention;
FIG. 15 a simplified equivalent circuit diagram of the circuit according to FIG. 14, and
FIG. 16 a chain with two-pole and three-pole filter units.

The following date are of importance for a band-pass filter (FIG. 1):
the central frequency $f_0$;
the bandwith $2\Delta f$;
the amplitude of the ripple $r$;
the edge steepness $s$ ($= tg\alpha$) and
the reverse attenuation $S_p$.

With the help of the said data a design for a band-pass filter can be made according to the Butterworth and Chebycheff method, in which monolithic filter units can be considered to be equivalent network structures consisting of resonance circuits with an equal resonance frequency. The filter design gives the following data of manufacture : the number of resonances within the pass band, the acoustic coupling coefficients, and the terminating impedance.

The coupling coefficients to be calculated can be obtained by correctly dimensioning : the mass of the electrodes, the length of the electrodes in the direction of the coupling axis, and the distance between each of the electrodes.

FIG. 2 represents a dual with two resonators 1 and 2, of which FIG. 3 shows the equivalent electric circuit.

The quantities $L_1$, $C_1$ and $C_{12}$ are dependent on the dimensions of the crystal plate and the electrodes, and on a number of physical constants. Moreover, $C_{12}$ is also dependent on the direction of transmission of the acoustic waves with respect to the crystal axes. The quantities $L_1$, $C_1$ and $C_{12}$ cannot be changed independently of one another, and a possible correction, made e.g. by vapour-deposit, is usually definitive.

The equivalent circuit according to FIG. 3 can be represented in a simplified way by the circuit of FIG. 4. In this circuit $$Z_1 = j\omega L_1 + \frac{1}{j\omega C_1} - \frac{1}{j\omega C_{12}};$$

$$Z_2 = \frac{1}{j\omega C_{12}};$$

$$Z_0 = \frac{1}{j\omega C_0}.$$

The resonance frequencies of this network can be determined by short-circuiting the filter at the output terminals (c, d FIG. 4) and by putting the input impedance zero.

$$Z_1 + \frac{Z_2 Z_1}{Z_1 + Z_2} = 0,$$

from which it follows that: $Z_1^2 + 2Z_1 Z_2 = 0$. Resonance takes place when $Z_1 = 0$ and also when $Z_1 = -2Z_2$. $Z_1 = 0$ gives $j\omega L_1 + 1/j\omega C_1 - 1/j\omega C_{12} = 0$
from which it follows that $$\omega_{r1} = \sqrt{\frac{1}{L_1 C_1} - \frac{1}{L_1 C_{12}}}.$$

$Z_1 = -2Z_2$ gives $j\omega L_1 + 1/j\omega C_1 + 1/j\omega C_{12} = 0$
or $$\omega_{r2} = \sqrt{\frac{1}{L_1 C_1} + \frac{1}{L_1 C_{12}}}.$$

From $\omega_0^2 = 1/L_1 C_1$ it follows that $\omega_{r1}^2 - \omega_0^2 = -1/L_1 C_{12}$ and $\omega_{r2}^2 - \omega_0^2 = 1/L_1 C_{12}$.

A good approach of these last two equations is: $\omega_{r1} - \omega_0 = -1/2\omega_0 L_1 C_{12}$ from which it follows that $$f_{r1} = f_0 - \frac{f_0}{2\frac{C_{12}}{C_1}};$$

$\omega_{r2} - \omega_0 = 1/2\omega_0 L_1 C_{12}$ from which it follows that $$f_{r2} = f_0 + \frac{f_0}{2\frac{C_{12}}{C_1}};$$

However, in most cases the edge steepness $s$ ($= \tg\alpha$) of a single dual will not meet the requirements. In order to make improvements in this respects several duals are combined to form a chain. FIG. 5 represents two duals connected in series, and FIG. 6 shows the associate equivalent circuit. Two fresh resonance frequencies are introduced by this series connection. In consequence of this the edge steepness is favourably influenced, it is true, but the capacitor $C_{23}$ will electrically detune the resonance frequency belonging to the resonators 2 and 3.

In the embodiment according to the invention one of the two fresh resonance frequencies is brought so far outside the pass-band area of the filter that this frequency no longer contributes to the transmission characteristic of the filter. This is attained by making the electric coupling impedance very much larger than the equivalent acoustic coupling impedance. The "electric coupling impedance" refers to the combination of the discrete shunt impedance and the internal electric port impedance of the units themselves. Thus, in FIG. 7, the electric coupling impedance is made up of the combination of the discrete shunt impedance L and the two internal impedances Co. The "equivalent acoustic coupling impedance" refers to the impedance which represents the acoustic coupling between the two resonators of a unit (e.g. resonators 1 and 2 in FIG. 2). In FIG. 7, the equivalent acoustic coupling impedance is represented by impedance $Z_2$.

FIG. 8 shows that the fourth resonance frequency $f_{r4}$ does not fall within the pass band. In this graphical representation $x$ represents the electric coupling impedance divided by the equivalent acoustic coupling impedance. If the electric coupling impedance is very large with respect to the equivalent acoustic coupling impedance, $x$ is large, and, consequently, $1/x$ is small.

The filter chain with three duals (FIG. 9, the equivalent circuit of which is represensted in FIG. 10, gives 6 resonance frequencies, of which only four are utilized for improving the transmission characteristic. This is shown by means of a graphical representation in FIG. 11.

The coupling inductance $L = 1/2\omega_0^2 C_0$ is influenced by the temperature. However, this influence can be made negligibly small by choosing the value 50% higher than the value indicated above. Every addition of a dual to the chain will introduce two further resonance frequencies, of which only one is utilized for improving the transmission characteristic. However, this hardly changes the bandwith. It means a considerable improvement with respect to the technique so far known. One drawback of a filter exclusively composed of duals is that $n$ resonators only give $n/2 + 1$ resonance frequencies within the pass band. This drawback can partly be removed by utilizing, instead of duals, filter units in which three resonators are provided on one crystal plate. FIG. 13 shows such a filter unit, and FIG. 14 a chain of such units. If, in this case, the distances $d_1$ and $d_2$ are equal to one another, it will result in a filter which behaves as four T-sections (FIG. 15). So, two three-pole filters connected in tandem give five resonance frequencies in the pass band, for 6 resonators give $2 \times 6/3 + 1$ resonance points in the pass band.

It will be clear that the invention is not limited to chains exclusively consisting of two-pole or three-pole filter units.

Figure 16:
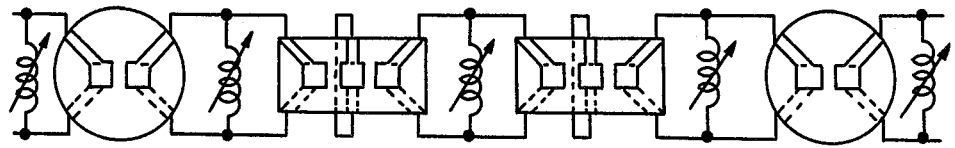

When combining three-pole and two-pole filter units in one filter chain, $2a + b + 1$ resonances fall within the pass band, $a$ representing the number of filter units with three resonators and $b$ the number of filter units with two resonators (FIG. 16).

Filters according to the invention can be applied inter alia as channel filters in carrier current systems in the frequency range of 2 MHz to 40 MHz.

What is claimed is:

1. A band-pass filter chain for passing frequencies within a given frequence band comprising a plurality of monolithic filter units made of quartz or other piezoelectric material and adapted to vibrate according to the thickness shear mode, each filter unit being provided with at least two acoustically coupled resonators, said filter units being coupled electrically so that the electric coupling impedances within the frequency pass band of the filter chain are substantially ohmic, the electric coupling impedances being very large with respect to the equivalent acoustic coupling impedances and the acoustic coupling coefficients all being equal.

2. A band-pass filter chain according to claim 1, wherein the filter chain comprises a filter units each having three resonators and b filter units each having two resonators all electrically coupled together whereby $2a + b + 1$ resonances fall within the frequency pass band.

3. A band-pass filter chain according to claim 1 wherein the electric coupling impedance comprises an external inductance which, together with the internal output or input capacitance of a filter unit, forms a parallel resonance circuit having the same resonance frequency as the filter units, the inductance value being chosen to be about 50% higher than the theoretically calculated value to produce resonance.

4. A band-pass filter circuit comprising a plurality of monolithic filter units adapted to vibrate in response to an applied electric signal and each of which includes at least two acoustically coupled resonators, said filter units all having the same acoustic coupling coefficients, and electric coupling impedance means electrically coupling said plurality of filter units together in cascade so as to provide a substantially ohmic or phase-shift-free electric coupling between units within the frequency pass band of the filter circuit, the electric coupling impedance means being chosen to have an impedance value that is greater than that of the equivalent acoustic coupling impedance of a filter unit.

5. A band-pass filter circuit as claimed in claim 4 wherein said electric coupling impedance means includes a separate inductor connected in shunt with the output resonator of one filter unit and the input resonator of the next succeeding filter unit.

6. A band-pass filter circuit as claimed in claim 4 wherein each filter unit includes a body of piezoelectric material adapted to vibrate in the thickness shear mode and said electric coupling impedance means includes a separate inductor between adjacent filter units.

7. A band-pass filter circuit as claimed in claim 4 wherein said electric coupling impedance means includes a separate inductor which forms a parallel resonant circuit with the internal capacitance of a filter unit and having the same resonant frequency as the filter unit, the inductor being chosen to have an inductance value about 50 per cent higher than the theoretical value required to produce said resonant frequency.

8. A band-pass filter circuit as claimed in claim 4 wherein the filter circuit comprises A filter units each having three acoustically coupled resonators and B filter units each having two acoustically coupled resonators with all filter units electrically coupled together to produce $2A + B + 1$ resonant frequencies within the frequency pass band of the filter circuit.

* * * * *